United States Patent
Hussain

(10) Patent No.: US 10,719,461 B2
(45) Date of Patent: Jul. 21, 2020

(54) SOLID STATE DEVICE WITH DISTRIBUTED BIT BUCKETS

(71) Applicant: Western Digital Technologies, Inc., San Jose, CA (US)

(72) Inventor: Atif Hussain, Denver, CO (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 73 days.

(21) Appl. No.: 16/057,608

(22) Filed: Aug. 7, 2018

(65) Prior Publication Data

US 2020/0050566 A1    Feb. 13, 2020

(51) Int. Cl.
*G06F 13/28* (2006.01)
*G06F 11/10* (2006.01)
*G06F 13/16* (2006.01)
*G11C 29/52* (2006.01)

(52) U.S. Cl.
CPC .......... *G06F 13/28* (2013.01); *G06F 11/1068* (2013.01); *G06F 13/1668* (2013.01); *G11C 29/52* (2013.01); *G06F 2213/28* (2013.01)

(58) Field of Classification Search
CPC .. G06F 13/28; G06F 11/1068; G06F 13/1668; G06F 2213/28; G11C 29/52
See application file for complete search history.

(56) References Cited

U.S. PATENT DOCUMENTS

| 8,290,919 | B1* | 10/2012 | Kelly | G06F 16/1827 707/698 |
| 10,114,846 | B1* | 10/2018 | Shah | G06F 16/90348 |
| 2002/0194569 | A1* | 12/2002 | Freissmann | G11B 20/1809 714/784 |
| 2006/0150062 | A1* | 7/2006 | Huang | G01R 31/31816 714/763 |
| 2015/0095696 | A1* | 4/2015 | Hess | G06F 11/108 714/6.24 |
| 2016/0202936 | A1* | 7/2016 | Lesartre | G06F 12/121 711/133 |

* cited by examiner

*Primary Examiner* — Guy J Lamarre
(74) *Attorney, Agent, or Firm* — Loza & Loza, LLP; Gabriel Fitch

(57) ABSTRACT

Aspects of the disclosure provide a solid state device that includes a non-volatile memory and a controller. The controller includes a processor, a memory, and a direct memory access (DMA) circuitry. The memory comprises a plurality of addresses. The DMA circuitry is configured to receive a first read request for data stored at a first address of the memory; determine whether the first address is an address from the plurality of addresses; when the first address is amongst the plurality of addresses, provide a first response comprising a particular data, without retrieving data stored at the first address; and when the first address is not amongst the plurality of addresses, retrieve the data stored at the first address, and provide a first response comprising the data retrieved from the first address.

30 Claims, 9 Drawing Sheets

SOLID STATE DEVICE WITH DISTRIBUTED BIT BUCKETS

FIELD

The present invention relates to solid state devices (SSDs), and more particularly to a solid state device (SSD) comprising distributed bit buckets.

INTRODUCTION

In a variety of consumer electronics, solid state devices (SSDs) incorporating non-volatile memories (NVMs) are frequently replacing or supplementing conventional rotating hard disk drives for mass storage. These non-volatile memories may include one or more flash memory devices, such as NAND flash memories. These SSDs provide better performance than conventional rotating hard disk drives.

Many of these SSDs provide functionalities such as error detection and correction, which helps ensure that accurate data is stored and accessed at the SSD. However, the error detection and correction functionality in an SSD reduces the speed of the SSD because the controller of the SSD has to perform additional computations and processing of data. In addition, error detection and correction functionality can take up valuable space in the memory of the controller of the SSD, since memory blocks have to be allocated for functions and data of the error detection and correction functionality. Moreover, error detection and correction may require a lot of additional data to travel through physical interconnects in the SSD, creating a lot of data traffic that has to be processed by the controller of the SSD.

To improve storage performance while still providing important functionalities such as error detection and correction, an improved SSD is proposed that provides better performance by reducing the amount of unnecessary data that travels through physical interconnects in the SSD.

SUMMARY

According to an aspect, a data storage apparatus includes a non-volatile memory (NVM) and a controller coupled to the NVM. The controller includes a processor, a memory coupled to the processor, and a direct memory access (DMA) circuitry. The memory includes a plurality of addresses. The DMA circuitry is coupled to the processor and the memory. The DMA circuitry is configured to (i) receive a first request for data stored at a first address of the memory; (ii) determine whether the first address is an address from the plurality of addresses of the memory; (iii) when the first address is amongst the plurality of addresses, provide a first response comprising a particular data, without retrieving data stored at the first address of the memory; and (iv) when the first address is not amongst the plurality of addresses, retrieve the data stored at the first address of the memory, and provide a first response comprising the data retrieved from the first address of the memory.

According to an aspect, a data storage apparatus includes a non-volatile memory (NVM) and a controller coupled to the NVM. The controller includes a processor, a memory coupled to the processor, and a first hardware engine coupled to the processor and the memory. The memory includes a first plurality of addresses, the plurality of addresses configured to store dummy data. The first hardware engine includes a first internal memory. The first hardware engine is configured to (i) receive a first read request for data stored at a first address of the memory; (ii) determine whether the first address is an address from the plurality of addresses of the memory; (iii) when the first address is amongst the plurality of addresses, provide a first response comprising a particular data stored at the first internal memory, without retrieving data stored at the first address of the memory; and (iv) when the first address is not amongst the plurality of addresses, retrieve the data stored at the first address of the memory, and provide a first response comprising the data retrieved from the first address of the memory.

According to another aspect, a method for operating a data storage apparatus is disclosed. The method receives a first read request for data stored at a first address of a memory of the SSD. The method determines whether the first address is an address from a plurality of addresses of the memory. When the first address is amongst the first plurality of addresses, the method provides a first response comprising a particular data, without retrieving data stored at the first address of the memory. When the first address is not amongst the plurality of addresses, the method (i) retrieves data stored at the first address of the memory, and (ii) provides a first response comprising the data retrieved from the first address of the memory.

According to another aspect, an apparatus includes means for non-volatile storing of data, and means for controlling the means for non-volatile storing of data. The means for controlling the non-volatile storing of data includes means for processing data and means for storing data comprising a plurality of addresses. The means for storing data is coupled to the means for processing data. The plurality of addresses is configurable to have different numbers of addresses. The means for controlling the non-volatile storing of data includes means for direct memory access (DMA) coupled to the means for storing data and the means for processing data. The means for DMA is configured to (i) receive a first read request for data stored at a first address of the memory; (ii) determine whether the first address is an address from the plurality of addresses of the memory; (iii) when the first address is amongst the plurality of addresses, provide a first response comprising a particular data, without retrieving data stored at the first address of the means for storing data, wherein the particular data that is included with the first response is different than the data that is stored at the first address of the means for storing data; and (iv) when the first address is not amongst the plurality of addresses, retrieve data stored at the first address of the means for storing data, and provide a first response comprising the data retrieved from the first address of the means for storing data.

According to another aspect, a controller is disclosed. The controller includes a processor, a memory coupled to the processor, and a direct memory access (DMA) circuitry coupled to the processor and the memory. The memory includes a plurality of addresses. The plurality of addresses is programmable such that a subset of addresses from the plurality of addresses, is configured to be used as a bit bucket. The DMA circuitry is configured to receive a first read request for data stored at a first address of the memory. The DMA circuitry is configured to determine whether the first address is an address from the subset of addresses of the memory. When the first address is amongst the subset of addresses, the DMA circuitry is configured to provide a first response comprising a particular data, without retrieving data stored at the first address of the memory. When the first address is not amongst the subset of addresses, the DMA circuitry is configured to (i) retrieve the data stored at the first address of the memory, and (ii) provide a first response comprising the data retrieved from the first address of the memory.

DETAILED DESCRIPTION

The present disclosure provides a data storage device/apparatus. The data storage device/apparatus may be a solid state device (SSD). In one aspect, the SSD may be a solid state drive. A data storage apparatus, such as an SSD, may include a non-volatile memory (NVM) and a controller coupled to the NVM. The controller includes a processor, a memory coupled to the processor, and a direct memory access (DMA) circuitry. The memory includes a plurality of addresses. The DMA circuitry is coupled to the processor and the memory. The DMA circuitry is configured to (i) receive a first request for data stored at a first address of the memory; (ii) determine whether the first address is an address from the plurality of addresses of the memory; (iii) when the first address is determined to be an address from the plurality of addresses, provide a first response comprising a particular data, without retrieving data stored at the first address of the memory; and (iv) when the first address is determined to be an address that is not from the plurality of addresses, retrieve the data stored at the first address of the memory, and provide a first response comprising the data retrieved from the first address of the memory. In some implementations, the processor, the memory, and the DMA circuitry are implemented in a System on Chip (SoC).

Figure 1:
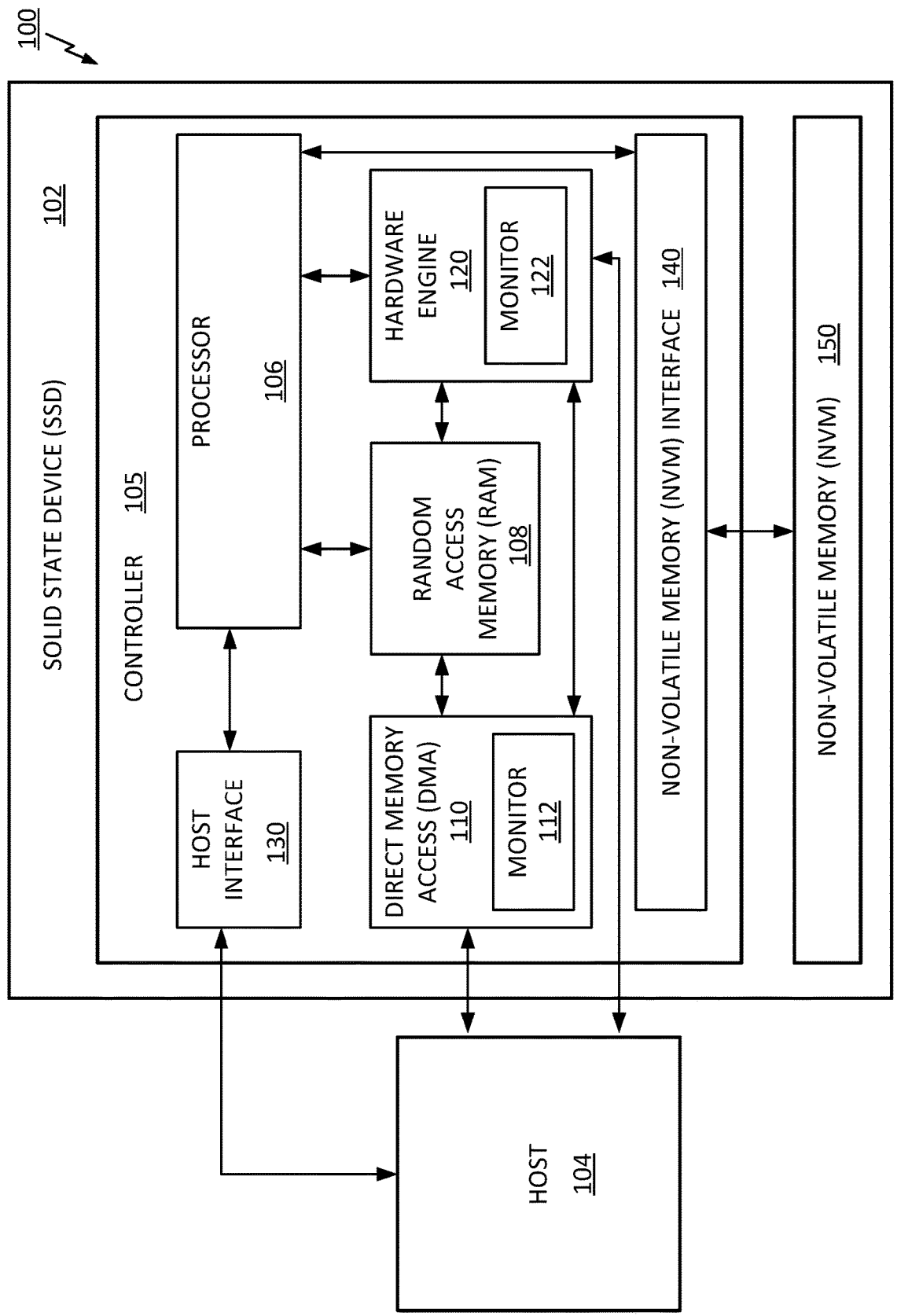
FIG. 1 illustrates a block diagram of a solid state device (SSD) that includes a controller with distributed monitors in accordance with embodiments of the present disclosure.

FIG. 1 illustrates a block diagram of a device 100 that includes a solid state device (SSD) with distributed bit bucket functionalities. The device 100 includes a solid state device (SSD) 102 and a host 104. The SSD 102 may be an example of a data storage apparatus. In some implementations, the SSD 102 may be implemented as a solid state drive. The SSD 102 is coupled to the host 104. One or more interconnects may provide physical input/output (I/O) data connections between the SSD 102 and the host 104. Data that travels between the SSD 102 and the host 104 may be referred as I/O overhead. Data can include instructions, commands and/or responses. As will be further described below, the distributed bit bucket functionality may be implemented in a hardware engine and/or a direct memory access (DMA) circuitry of the controller of the SSD 102.

The host 104 may be any system and/or device having a need for data storage or retrieval and a compatible interface for communicating with the SSD 102. For example, the host 104 may be a computing device, a personal computer, a portable computer, a workstation, a server, a router, a network device, a personal digital assistant, a digital camera, a digital phone, or combinations thereof. The host 104 can include several hosts. The host 104 may be a separate (e.g., physically separate) device from the SSD 102. In some embodiments, the host 104 includes the SSD 102. In other embodiments, the SSD 102 is remote with respect to the host 104 or is contained in a remote computing system communicatively coupled with the host 104. For example, the host 104 may communicate with the SSD 102 through a wireless communication link.

The host 104 provides commands to the SSD 102 for transferring data between the host 104 and the SSD 102. For example, the host 104 may provide a write command to the SSD 102 for writing data to the SSD 102, or a read command to the SSD 102 for reading data from the SSD 102. The SSD 102 may provide a response, to the write command or the read command, to the host 104 through the one or more interconnects.

The SSD 102 includes a controller 105 and a non-volatile memory (NVM) 150, such as NAND Flash memory. The controller 105 includes a processor 106 (or alternatively, an NVM processor 106), a random access memory (RAM) memory 108, a direct memory access (DMA) circuitry 110, a hardware engine 120, a host interface 130, and a non-volatile memory (NVM) interface 140. The controller 105 is configured to control the NVM 150. The controller 105 may be implemented in a System on Chip (SoC). The processor 106 may be a processor die, the memory 108 may be a memory die, the DMA circuitry 110 may be a DMA die, and the hardware engine 120 may be a hardware engine die 120. In some implementations, two or more of the above components (e.g., DMA circuitry, hardware engine) may be implemented as a single die.

The host interface 130 is coupled to the processor 106. The host interface 130 facilitates communication between the host 104 and other components of the SSD 102, such as the processor 106 and/or the RAM 108. The host interface 130 may be any type of communication interface, such as an Integrated Drive Electronics (IDE) interface, a Universal Serial Bus (USB) interface, a Serial Peripheral (SP) interface, an Advanced Technology Attachment (ATA) or Serial Advanced Technology Attachment (SATA) interface, a Small Computer System Interface (SCSI), an IEEE 1394 (Firewire) interface, Non Volatile Memory Express (NVMe), or the like.

The processor 106 is coupled to the RAM memory 108 and the hardware engine 120. The processor 106 is also coupled to the NVM 150 via the NVM interface 140. The processor 106 controls operation of the SSD 102. In various aspects, the processor 106 receives commands from the host 104 through the host interface 130 and performs the commands to transfer data between the host 104 and the NVM 150. Furthermore, the processor 106 may manage reading from and writing to the memory 108 for performing the various functions effected by the processor 106 and to maintain and manage cached information stored in memory 108.

The processor 106 may include any type of processing device, such as a microprocessor, a microcontroller, an embedded controller, a logic circuit, software, firmware, or the like, for controlling operation of the SSD 102. In some aspects, some or all of the functions described herein as being performed by the processor 106 may instead be performed by another component of the SSD 102. For example, the SSD 102 may include a microprocessor, a microcontroller, an embedded controller, a logic circuit, software, firmware, or any kind of processing device, for performing one or more of the functions described herein as being performed by the processor 106. According to other aspects, one or more of the functions described herein as being performed by the processor 106 are instead performed by the host 104. In still further aspects, some or all of the functions described herein as being performed by the processor 106 may instead be performed by another component such as a processor in a hybrid drive including both non-volatile memory elements and magnetic storage elements.

The memory 108 may be any memory, computing device, or system capable of storing data. For example, the memory 108 may be a random-access memory (RAM), a dynamic random-access memory (DRAM), a double data rate (DDR) DRAM, a static random-access memory (SRAM), a synchronous dynamic random-access memory (SDRAM), a flash storage, an erasable programmable read-only-memory (EPROM), an electrically erasable programmable read-only-memory (EEPROM), or the like. In various embodiments, the processor 106 uses the memory 108, or a portion thereof, to store data during the transfer of data between the host 104 and the NVM 150. For example, the memory 108 or a portion of the memory 108 may be a cache memory. The memory 108 may be a shared memory that is accessible by different components, such the processor 106, the DMA circuitry 110 and the hardware engine 120.

The NVM 150 receives data from the processor 106 via the NVM interface 140 and stores the data. The NVM 150 may be any type of non-volatile memory, such as a flash storage system, a NAND-type flash memory, a solid state storage device, a flash memory card, a secure digital (SD) card, a universal serial bus (USB) memory device, a CompactFlash card, a SmartMedia device, a flash storage array, or the like. In one aspect, where the NVM 150 includes a flash storage system, the NVM interface 140 may be a flash memory interface.

The DMA circuitry 110 and the hardware engine 120 may be coupled to the memory 108. In addition, the DMA circuitry 110 may be coupled to the hardware engine 120. The DMA circuitry 110 and the hardware engine 120 may be coupled to the interconnects to communicate with the host 104 and/or any other device(s) coupled to the SSD 102. Thus, the DMA circuitry 110 and the hardware engine 120 may be able to bypass the processor 106 to communicate with other devices outside of the controller 105 and/or the SSD 102. The hardware engine 120 may provide different functionalities. The hardware engine 120 may include error detection and correction functionalities. The hardware engine 120 may use error correcting code (ECC) and/or low density parity check (LDPC), as ways to provide error detection and correction functionalities. Although not shown, the hardware engine 120 may include a DMA circuitry. The DMA circuitry 110 and the hardware engine 120 may each include their own respective memory (e.g., DMA internal memory, hardware engine internal memory), which is not shown.

The DMA circuitry 110 may include any type of processing device, such as a microprocessor, a microcontroller, an embedded controller, a logic circuit, software, firmware, or the like, for controlling certain operations of the SSD 102.

In some aspects, some or all of the functions described herein as being performed by the DMA circuitry 110 may instead be performed by another component of the SSD 102. For example, the SSD 102 may include a microprocessor, a microcontroller, an embedded controller, a logic circuit, software, firmware, or any kind of processing device, for performing one or more of the functions described herein as being performed by the DMA circuitry 110. According to other aspects, one or more of the functions described herein as being performed by the DMA circuitry 110 are instead performed by the host 104. In still further aspects, some or all of the functions described herein as being performed by the DMA circuitry 110 may instead be performed by another component such as a processor in a hybrid drive including both non-volatile memory elements and magnetic storage elements.

Similarly, the hardware engine 120 may include any type of processing device, such as a microprocessor, a microcontroller, an embedded controller, a logic circuit, software, firmware, or the like, for controlling certain operations of the SSD 102. In some aspects, some or all of the functions described herein as being performed by the hardware engine 120 may instead be performed by another component of the SSD 102. For example, the SSD 102 may include a microprocessor, a microcontroller, an embedded controller, a logic circuit, software, firmware, or any kind of processing device, for performing one or more of the functions described herein as being performed by the hardware engine 120. According to other aspects, one or more of the functions described herein as being performed by the hardware engine 120 are instead performed by the host 104. In still further aspects, some or all of the functions described herein as being performed by the hardware engine 120 may instead be performed by another component such as a processor in a hybrid drive including both non-volatile memory elements and magnetic storage elements.

The DMA circuitry 110 includes a monitor 112. The monitor 112 monitors data traffic that flows through the DMA circuitry 110, analyses the data to see whether there is a request (e.g., read request) for bit bucket data, and provides appropriate action and response to the request (e.g., read request). The DMA circuitry 110 may include its own DMA memory. Similarly, the hardware engine 120 includes a monitor 122. The monitor 122 is similar to the monitor 112 of the DMA circuitry 110. The monitor 122 may be implemented as part of a DMA circuitry of the hardware engine 120. The monitor 122 monitors data traffic that flow through the hardware engine 120, analyses the data to see whether there is a request for a bit bucket data, and provides appropriate action and response to the request. The hardware engine 120 may include its own DMA memory. The monitor 112 and the monitor 122 may operate independently of each other.

A bit bucket is a function that returns a predetermined value back to a request. In some implementations, a request to a bit bucket may return zero value data (e.g., data includes bit value of all zeros, 00000000). In some instances, the value of the bit bucket is stored at a particular address of memory 108. In some implementations, any reference for data at that particular address may be considered a request for data at a bit bucket. In some implementations, data from a bit bucket may be used to fill or pad data for other addresses. For example, if a particular address or request has the following data, 10111, then the bit bucket data can be used so that the particular address or request has the following data 10111000. In some implementations, a memory block at that particular address may be allocated as a bit bucket. While zero value data is one example of predetermined data for the bit bucket, other implementations may use other data (e.g., dummy data, random value data, specific value data). The size of the data may vary and is not limited to a particular size. The size of the bit bucket is variable to accommodate different requests from the DMA circuitry 110 and/or the hardware engine 120. In some implementations, a bit bucket can be sufficiently large enough in size to reduce the number of transfer request from the DMA circuitry 110 and/or the hardware engine 120.

The size of the bit bucket may be programmable. In some implementations, each monitor (e.g., 112, 122) may include software programmable register(s) that indicates an address range. When a reference to data at a particular address falls within that address range, the monitor (e.g., 112, 122) returns the bit bucket data instead of requesting it from the memory (e.g., 108).

As an example, let's assume a transfer request size is 100 elements and the transfer starting address is 1000. A firmware may configure or program the start of the bit bucket address to be 1010 and end at 1090 (which is a size of 80). In this case, the bit bucket size is 80, so from 1000 to 1009, the request will go out and get data stored at the memory. From 1010 to 1090, a monitor (e.g., 112, 122) will return the bit bucket value, then from 1091 to 1100, the request will go out and get data stored at the memory (e.g., 108).

In another example, let's assume a transfer request size is 200 elements and the transfer starting address is a 1000. A firmware may configure or program the start of the bit bucket address to be 1030 and end at 1100 (which is a size of 70). In this case, the bit bucket size is 70, so from 1000 to 1029, the request will go out and get data stored at the memory. From 1030 to 1100, a monitor will return the bit bucket value, then from 1101 to 1200, the request will go out and get data stored at the memory. Thus, the bit bucket can have different sizes and so can the transfer request. More specific examples of bit buckets and requests are further described below.

As will be further described below, when the monitor (e.g., 112, 122) detects a request for data at a bit bucket, the monitor may provide a response without retrieving the data at the bit bucket, since the monitor is aware of the value of the data that is supposed to be stored at the bit bucket. This reduces the amount of data traffic that travels in the controller 105, thereby improving the speed of the SSD 102. For example, when the monitor detects a request for data stored at a particular address of the memory 108, the monitor may bypass retrieving data stored at that particular address of the memory 108, and instead provides a response to the request that includes the data that is supposed to be stored at the particular address of the memory 108. In addition to reducing data traffic, this approach also saves energy, since the memory won't necessarily be accessed when the request is for data at a bit bucket.

However, when the monitor (e.g., 112, 122) detects a request for data that is not part of the bit bucket, the DMA circuitry 110 and/or the hardware engine 120 may retrieve the data at the memory 108 and provide a response that includes the retrieved data. More detailed examples of how requests (e.g., read requests) for data are processed by the DMA circuitry and/or the hardware engine of the SSD are further described below.

Figure 2:
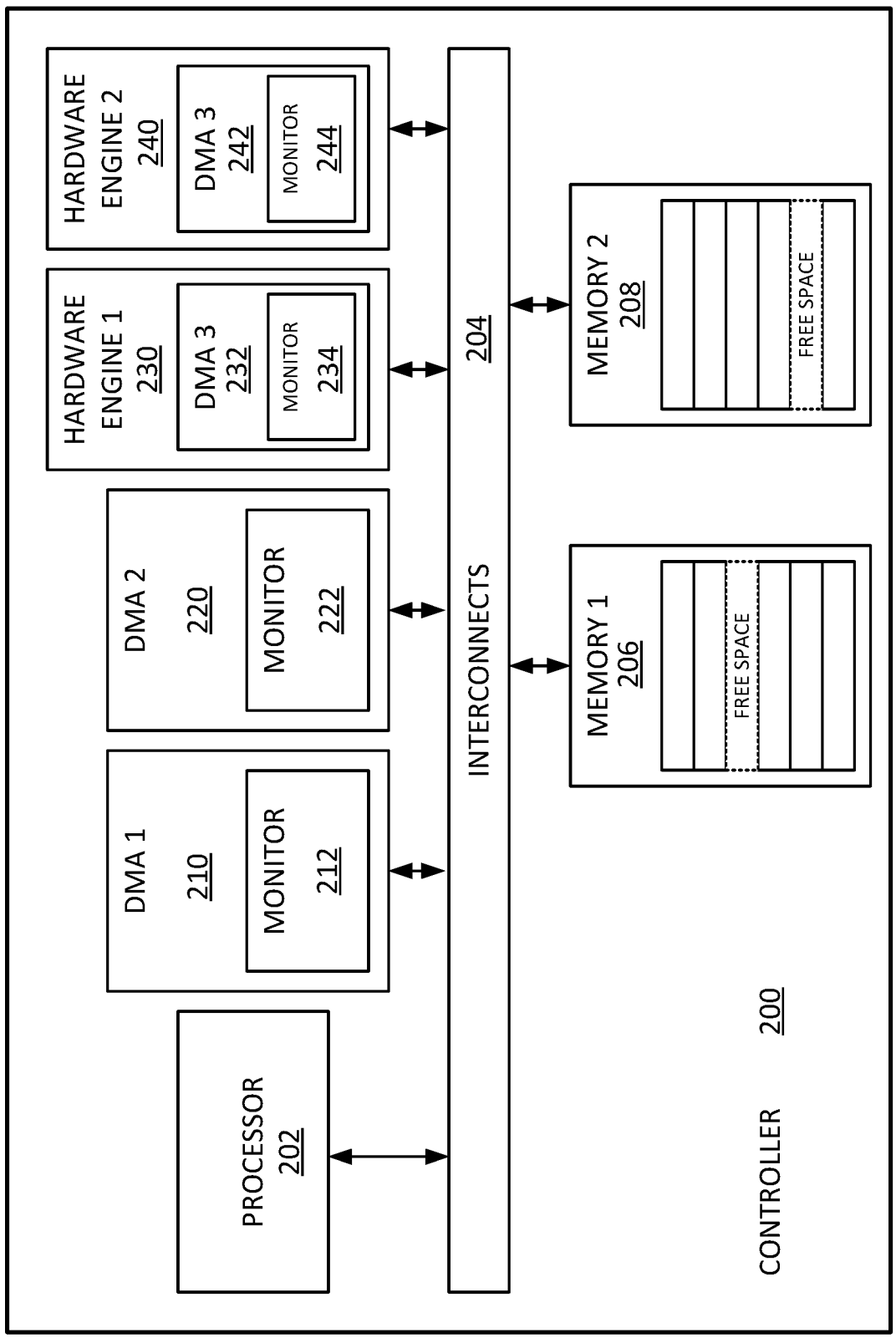
FIG. 2 illustrates a block diagram of a controller for a solid state device (SSD), with distributed monitors in accordance with embodiments of the present disclosure.

FIG. 2 illustrates a block diagram of a controller 200 of a solid state SSD with distributed bit bucket functionalities. The controller 200 includes the processor 202, interconnects 204, a first memory 206, a second memory 208, a first direct memory access (DMA) circuitry 210, a second direct memory access (DMA) circuitry 220, a first hardware engine 230, and a second hardware engine 240. Although not shown, the controller 200 may include other components, such as a host interface and an NVM interface, as described in FIG. 1. As shown in FIG. 2, the various components of the controller 200 may communicate with each other through the interconnects 204. The interconnects 204 represent physical interconnects that couple the processor 202, the first memory 206, the second memory 208, the first DMA circuitry 210, the second DMA circuitry 220, the first hardware engine 230, and the second hardware engine 240. The first memory 206 and the second memory 208 may be shared memories that are accessible by the processor 202, the first memory 206, the second memory 208, the first DMA circuitry 210, the second DMA circuitry 220, the first hardware engine 230, and the second hardware engine 240. It is noted that each of the first DMA circuitry 210, the second DMA circuitry 220, the first hardware engine 230, and the second hardware engine 240 may include their own respective memory (e.g., DMA internal memory, hardware engine internal memory), which is not shown. In some implementations, each of the processor 202, the first memory 206, the second memory 208, the first DMA circuitry 210, the second DMA circuitry 220, the first hardware engine 230, and the second hardware engine 240, may be implemented as their own die, and coupled together in a System on Chip (SoC). In some implementations, two or more of the above components and/or circuitry (e.g., first DMA circuitry 210, second DMA circuitry 220) may be implemented as a single die.

The controller 200 may represent a more detailed illustration of the controller 105 of FIG. 1. For example, the processor 202 may be the processor 106, the first memory 206 and the second memory 208 may be the memory 108, the first DMA circuitry 210 and the second DMA circuitry 220 may be the DMA circuitry 110, and the hardware engine 230 and the hardware engine 240 may be the hardware engine 120. The first DMA circuitry 210 includes a monitor 212, and the second DMA circuitry 220 includes a monitor 222. The first hardware engine 230 includes a third DMA circuitry 232, and the second hardware engine 240 includes a fourth DMA circuitry 242. The third DMA circuitry 232 includes a monitor 234, and the fourth DMA circuitry 242 includes a monitor 244.

Each monitor of the DMA circuitry may monitor data traffic in its respective DMA channel to determine whether any data request is a request (e.g., read request) for data at a bit bucket. The first memory 206 includes a plurality of addresses. Each address of the first memory 206 may represent a memory block of the first memory 206. Similarly, the second memory 208 includes a plurality of addresses. Each address of the second memory 208 may represent a memory block of the second memory 208. The first memory 206 and the second memory 208 include a first plurality of addresses that are allocated as free space. The first plurality of addresses may be contiguous addresses in the first memory 206 and/or the second memory 208, or addresses that are non-contiguous to each other, or combinations thereof. In some implementations, these first plurality of addresses may be allocated for bit bucket use. It is noted that even through the memory block is allocated as free space, that memory block may still store residual data. That residual data may be zero value data, dummy data, or random data. The residual data stored in the memory block specified as free space may be similar or different than the data that is supposed to be returned in response to a request (e.g., read request) for data at that particular memory block.

Figure 3:
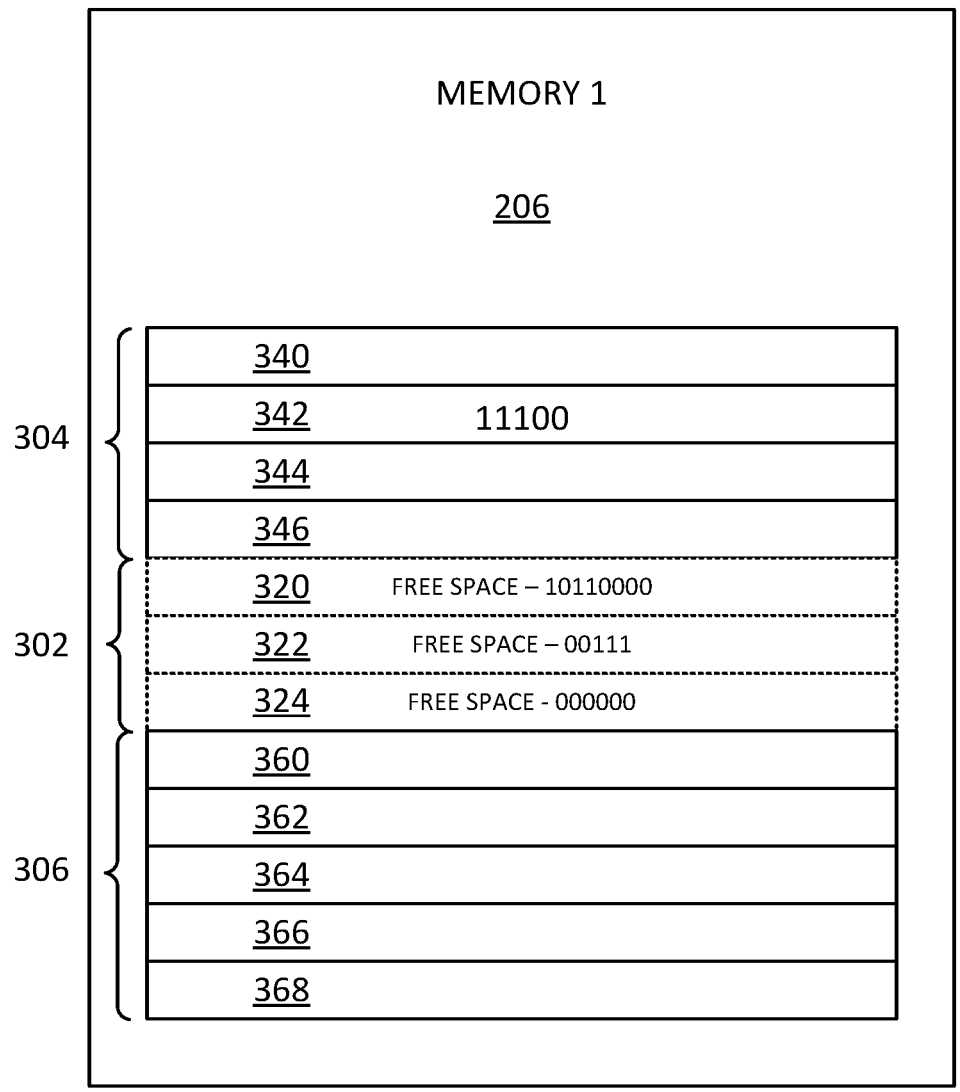
FIG. 3 illustrates a diagram of a memory comprising several addresses in accordance with embodiments of the present disclosure.

FIG. 3 illustrates a block diagram of the first memory 206. The first memory 206 includes a first plurality of addresses 302, a second plurality of addresses 304 and a third plurality addresses 306. The first plurality of addresses 302 includes a first address 320, a second address 322 and a third address 324. The second plurality of addresses 304 includes addresses 340-346. The third plurality of addresses 306 includes addresses 360-368. The size and location of the first plurality of addresses 302 may vary with different implementations. That is, the size and/or location of addresses from the first plurality of addresses 302 may be configurable and/or programmable. For example, in a different implementation, the first plurality of addresses 302 may include addresses 322-324 and addresses 360-362. The first plurality of addresses 302 may include addresses that are contiguous in the memory 206 or non-contiguous in the memory 206. The first plurality of addresses 302 may be used by some or all of the DMA circuitry and/or the hardware engine(s) of the SSD storage device. In some implementations, the first plurality of addresses 302 may include addresses that are to be used with only certain DMA circuitry and/or hardware engine(s). In some implementations, each DMA circuitry and hardware engine may have their own respective first plurality of addresses in the memory.

FIG. 3 illustrates that even though the first plurality of addresses 302 is allocated as free space, each address from the first plurality of addresses 302 may include residual data with different values and/or different sizes. Despite each address from the first plurality of addresses 302 comprising different residual values, any request for data at one or more address from the first plurality of addresses 302, will result in a response that includes the same data. For example, in some implementations, all responses for data for one or more addresses from the first plurality of addresses 302 may include the same zero value data (e.g., 000, 000000, 00000000). The size of the zero value data may vary with different implementations. FIG. 3 illustrates exemplary data that may be stored at particular addresses. Other implementations may store data with different values.

FIG. 3 illustrates one example of a memory that can be used for the first plurality of addresses. In some implementations, the first plurality of addresses (e.g., 302) of a memory (e.g., 206, 208) may be a subset of addresses from a plurality of addresses of the memory. Addresses of other memory devices may be part of the first plurality of addresses. For example, the memory could be a memory of a controller of an SSD and/or a memory of an SSD that is located outside of the controller.

Referring back to FIG. 2, whenever a request (e.g., read request) for data specifies an address that is allocated as free space, the monitor (e.g., 212, 222, 234, 244) and/or the DMA circuitry (e.g., 210, 220, 232, 242) may determine that the request is for data at a bit bucket. In which case, the monitor and/or the DMA circuitry may provide a response with a pre-determined data value, without accessing and/or retrieving the data at the specified address of the memory. However, when the request (e.g., read request) for data specifies an address that is not allocated as free space, the DMA circuitry may retrieve the data stored at the specified address of the memory and provides a response that includes the retrieved data. While monitoring and analyzing the data traffic may increase the computational load of the controller, this is offset by the reduction in the amount of unnecessary data traffic that flows through the interconnects 204. The result is an SSD with improved overall performance. In addition, by distributing the decision-making process of how to process requests and/or transfers of data, to the DMA(s), there is no longer a need for a stand-alone bit bucket device (e.g., bit bucket component that is physically separate from the processor, the DMA circuitry, and the hardware engine, separate hardware bit bucket component) in the SSD storage device. This reduces the overall size of the controller and/or the SSD storage device. Also, since the monitor and/or the DMA circuitry provide the response(s) for bit bucket data without needing to access the memory, memory is freed up and may be available to be used by the controller and/or the SSD storage device. Thus, in some implementations, the controller (e.g., processor) may use the part of the memory that has been allocated for bit bucket, for storing and/or retrieving data that can be used by the controller (e.g., processor), but not necessarily by other devices coupled to the controller. As an example, in some implementations, the processor of the controller may store and/or retrieve data in the part of the memory that has been allocated for use as a bit bucket by the monitor(s) and/or DMA circuitry of the controller.

As mentioned above, the hardware engine (e.g., 120, 230, 240) may use error correcting code (ECC) and/or low-density parity check (LDPC), as ways to provide error detection and correction functionalities. These error detection and correction functionalities use bit bucket values often, and thus the described SSD architecture provides an effective approach to reducing data traffic while still providing robust error detection and correction at optimized speeds. The bit bucket values may also be used to fill or pad data other data. Other uses of bit bucket data include the zeroing out of the allocated for use portion of the memory of the controller by the DMA circuitry. If the allocation for use portion of the memory is large, then many requests need to be made to zero out the allocated for use portion of the memory. However, if the first plurality of addresses that is allocated as free space is large or larger, then the number of requests to zero out the allocated for use portion of the memory is reduced.

Having described various components of an SSD that includes distributed bit buckets, methods and flow sequences of how the SSD with distributed bit buckets operate will now be described below.

Exemplary Flow Chart of Method of Processing Request for Data

Figure 4:
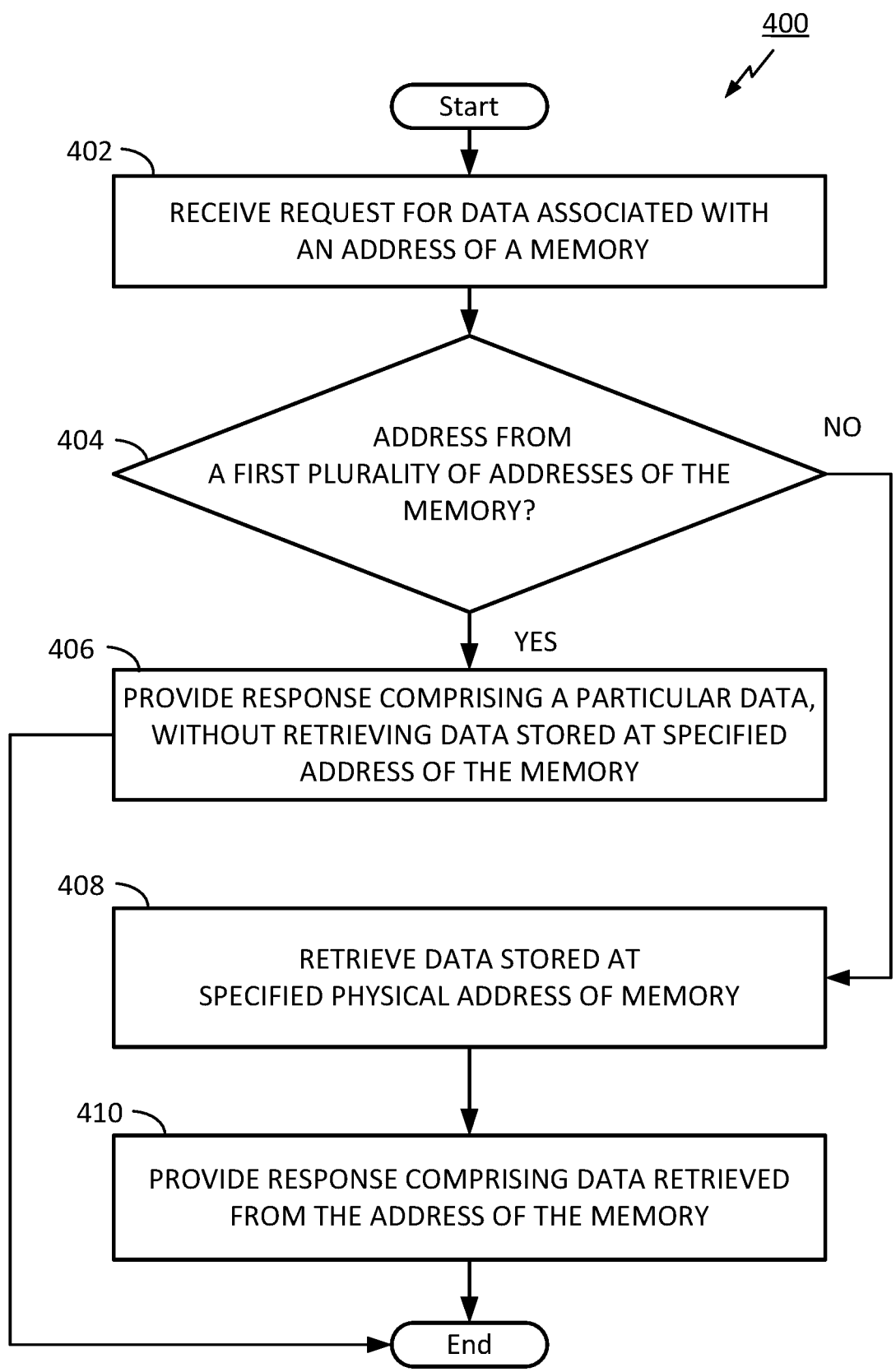
FIG. 4 illustrates a flow diagram of a method for accessing data at a memory in accordance with embodiments of the present disclosure.

FIG. 4 illustrates a flow chart of a method 400 for processing requests (e.g., read requests) for data stored at a memory. The method shown in FIG. 4 may be performed by any of the SSD storage devices described in the present disclosure, such as the SSD 102. Also, for purpose of clarity, the method shown in FIG. 4 does not necessarily show all the operations performed by the SSD storage device. In some implementations, the method shown in FIG. 4 may include other operations that can be performed by the SSD storage device. In some implementations, the order of the methods may be changed. The method 400 may be performed by a DMA circuitry and/or a monitor of the SSD storage device, as described above. In some implementations, the method 400 may be performed by the DMA circuitry and/or the monitor of a hardware engine.

The method (at 402) receives a request (e.g., read request) for data associated with and/or stored at an address (e.g., physical address) of a memory (e.g., 206) of the controller. The request may be received from a device, component, or peripheral outside of an SSD or outside of an SSD controller. The request may be received through a DMA channel that bypasses the processor (e.g., 202) of the controller (e.g., 200).

The method (at 404) determines whether the address specified in the request (e.g., read request) is an address from a first plurality of addresses (e.g., 302) of the memory (e.g., 206, 208). In some implementations, the first plurality of addresses of the memory are specified or allocated as free space. In which case, any request for data at an address from the first plurality of addresses is considered as request for data at a bit bucket. It is noted that the first plurality of addresses may include a range of addresses of various size and can include addresses located at more than one memory (e.g., first memory 206, second memory 208). The first plurality of addresses of the memory may be a subset of addresses from a plurality of addresses of the memory.

The request may include one address or may include several addresses. In cases where there are several addresses with the request, the method may process each address separately and make a determination for each address separately. In some implementations, the method may process the addresses collectively by determining whether all the addresses satisfy the condition. In some implementations, if at least one address does not satisfy the condition, then all addresses from the request may be considered to have not satisfied the condition.

When the method determines (at 404) the address specified in the request is an address that is not from the first plurality of addresses, the method 400 proceeds to retrieve (at 408) data stored at the specified address of the memory. The method then provides (at 410) a response that includes the retrieved data from the specified address of the memory. In this instance, the method determines that the request for data is not a request for a bit bucket data.

However, when the method determines (at 404) the address specified in the request (e.g., read request) is an address from the first plurality of address of the memory, the method 400 proceeds to provide (at 406) a response that includes a particular data (e.g., pre-determined data, zero value data), without accessing and/or retrieving the data that is stored at the specified address of the memory. In this instance, the method determines that the request for data is a request for bit bucket data. It is noted that in some implementations, requests for data at different addresses from the first plurality of addresses may result in responses that include the same data, even if different residual data values are stored at these different addresses of the first plurality of addresses of the memory. In this approach, the method is aware of what the value of the data should be at the addresses from the first plurality of addresses of the memory, and thus there is no need to retrieve data stored at these addresses from the first plurality of addresses.

The above method may be iteratively performed for some or all of the requests that flow through a DMA channel. The DMA circuitry and/or the monitor may monitor data traffic that flows through the DMA channel and performs the above method to determine how to process the requests. Each DMA circuitry and/or monitor of the SSD may perform the above method in parallel or sequentially to each other.

Figure 5:
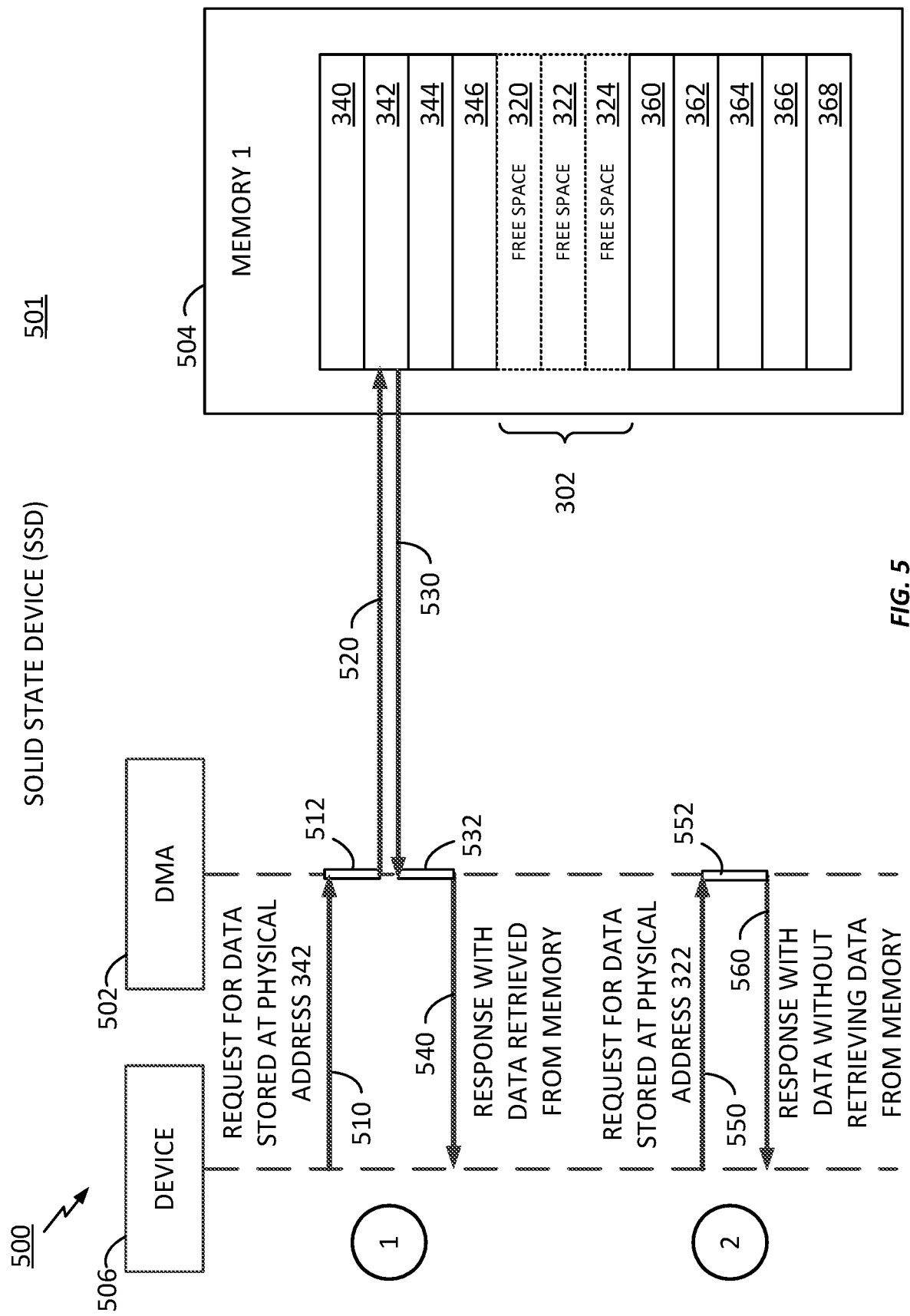
FIG. 5 illustrates a flow sequence diagram of a method for accessing data at a memory in accordance with embodiments of the present disclosure.
Figure 6:
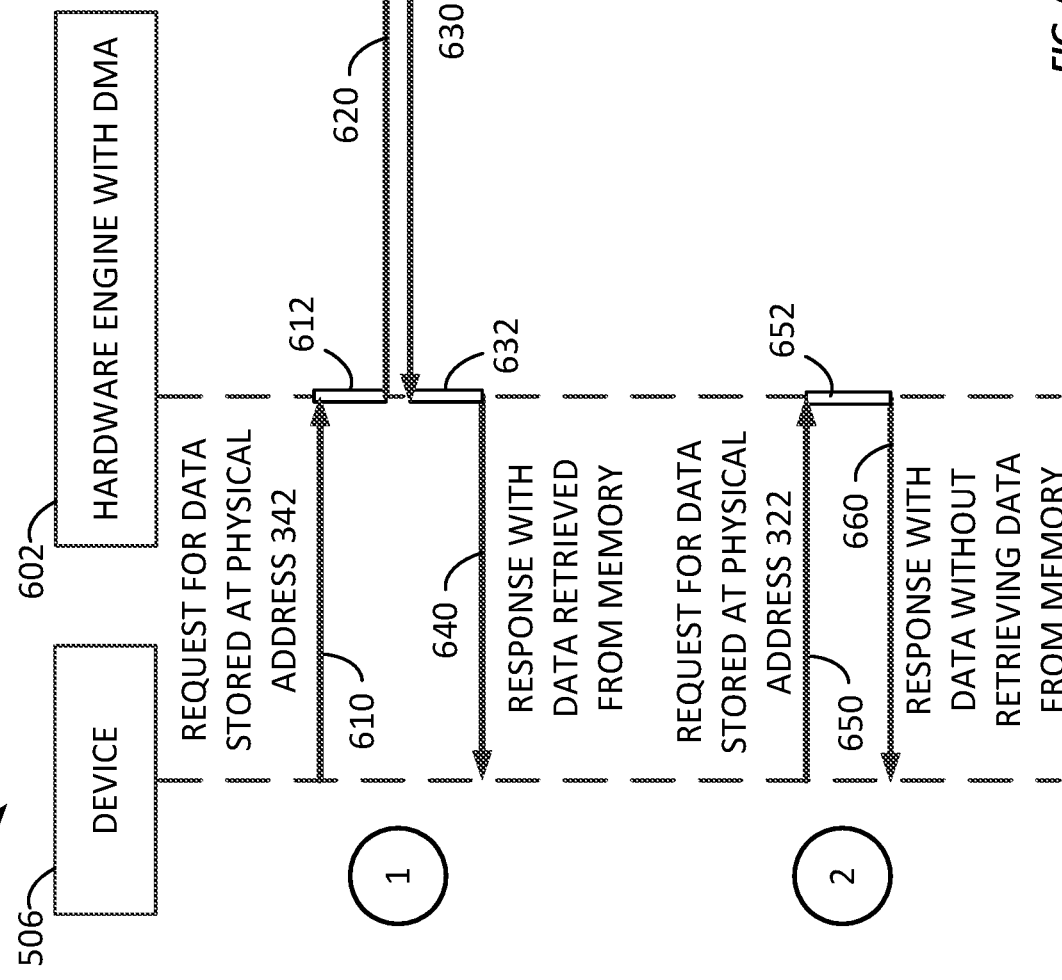
FIG. 6 illustrates a flow sequence diagram of a method for accessing data at a memory in accordance with embodiments of the present disclosure.

Exemplary Flow Sequences of a Solid State Device (SSD) Processing Request for Data at a Memory FIGS. 5 and 6 illustrate flow sequences of a solid state device (SSD) that processes various requests (e.g., read requests) for data. The flow sequences shown in FIGS. 5 and 6 may be performed by any of the SSDs described in the present disclosure, such as the SSD 102. Also, for purpose of clarity, the flow sequences shown in FIGS. 5 and 6 do not necessary show all the components of the SSD that perform the operations described in FIGS. 5 and 6. For example, one or more of the request, response, data described may travel through one or more buffers and/or one or more interconnects, when traveling between the different components of the SSD. In some implementations, the flow sequences shown FIGS. 5 and 6 may include other operations that are performed by the SSD.

FIG. 5 illustrates two flow sequences 500 that are performed by an SSD 501 coupled to a host (e.g., host 104). The flow sequences 500 include processing requests (e.g., read requests) for data at the memory 504. The SSD 501 includes a direct memory access (DMA) 502 circuitry and the memory 504. FIG. 5 also illustrates a device 506. The device 506 may be part of the SSD 501 or it may be a device that is external of the SSD 501. For purpose of describing FIG. 5, the device 506 shall be assumed to be implemented in the SSD 501.

As shown in FIG. 5, a first flow sequence illustrates that the DMA circuitry 502 receives a request (510) for data at address 342 of the memory 504, from the device 506. The DMA circuitry 502 determines (at 512) whether the address 342 is an address from a first plurality of addresses (e.g., 302). The first plurality of addresses 302 is allocated as free space. In this case, the address 342 is not part of the first plurality of addresses 302. As such, the DMA circuitry 502 retrieves data at the address 342 by (i) sending a request (520) for data at address 342, to the memory 504, and (ii) receiving a response (530) that includes the data stored at address 342, from the memory 504. The DMA circuitry 502 processes (at 532) the retrieved data from the address 342, and then sends a response (540) that includes the retrieved data from the address 342, to the device 506.

FIG. 5 also illustrates a second flow sequence where the DMA circuitry 502 receives a request (550) for data at address 322 of the memory 504, from the device 506. The DMA circuitry 502 determines (at 552) whether the address 332 is an address from the first plurality of addresses (e.g., 302). In this case, the address 332 is part of the first plurality of addresses 302. The DMA circuitry 502 knows that addresses from the first plurality of addresses 302 are to return a particular value (e.g., zero data value, random value, pre-determined value). The particular value may be stored in an internal memory of the DMA circuitry 502. The DMA circuitry 502 processes (at 552) the request (e.g., read request), and then sends a response (560) that includes the particular value, to the device 506. The response to the device 506 is sent to the device 506, without the DMA circuitry 502 accessing and/or retrieving data stored at the address 332 of the memory 504. Thus, as shown in this example, there is reduction (or elimination) in the amount of data traffic between the memory 504 and the DMA circuitry 502 of the SSD 501.

In some implementations, a request for data may include several addresses. The DMA circuitry 502 may process these addresses individually or collectively. For example, the DMA circuitry 502 may receive a request for data at address 320 and address 322. In such instances, since both of these addresses are part of the first plurality of addresses 302, the DMA circuitry 502 may provide a response, without accessing and/or retrieving data stored at the memory 504. In another example, the DMA circuitry 502 may receive a request (e.g., read request) for data at address 342 and address 322. In such instances, the DMA circuitry 502 may process the request as two separate requests, but may provide a single response to the device 506.

In some implementations, the communication between the device 506 and the DMA circuitry 502 flows through a DMA channel that bypasses a processor of the controller of the SSD. FIG. 5 illustrates how two requests for data at different addresses can result in the DMA circuitry 502 performing different responses, and the SSD 501 utilizing different resources.

FIG. 6 illustrates two flow sequences 600 that are performed by an SSD 501 coupled to a host (e.g., host 104). The flow sequences 600 include processing requests (e.g., read requests) for data at the memory 504. The SSD 501 includes a hardware engine 602 and the memory 504. The hardware engine includes a DMA circuitry. FIG. 6 also illustrates a device 506. The device 506 may be part of the SSD 501 or it may be a device that is external of the SSD 501. For purpose of describing FIG. 6, the device 506 shall be assumed to be implemented in the SSD 501.

As shown in FIG. 6, a first flow sequence illustrates that the hardware engine 602 receives a request (610) for data at address 342 of the memory 504, from the device 506. The hardware engine 602 determines (at 612) whether the address 342 is an address from a first plurality of addresses (e.g., 302). The first plurality of addresses 302 is allocated as free space. In this case, the address 342 is not part of the first plurality of addresses 302. As such, the hardware engine 602 retrieves data at the address 342 by (i) sending a request (620) for data at address 342 to the memory 504, and (ii) receiving a response (630) that includes the data stored at address 342, from the memory 504. The hardware engine 602 processes (at 632) the retrieved data from the address 342, and then sends a response (640) that includes the retrieved data from the address 342, to the device 506.

FIG. 6 illustrates a second flow sequence where the hardware engine 602 receives a request (650) for data at address 322 of the memory 504, from the device 506. The hardware engine 602 determines (at 652) whether the address 332 is an address from the first plurality of addresses (e.g., 302). In this case, the address 332 is part of the first plurality of addresses 302. The hardware engine 602 knows that addresses from the first plurality of addresses 302 are to return a particular value (e.g., zero data value, random value, pre-determined value). The particular value may be stored in an internal memory of the hardware engine 602. The hardware engine 602 processes (at 652) the request (e.g., read request), and then sends a response (660) that includes the particular value, to the device 506. The response to the device 506 is sent, without the hardware engine 602 accessing and/or retrieving data stored at the address 332 of the memory 504.

In some implementations, a request (e.g., read request) for data may include several addresses. The DMA circuitry 502 may process these addresses individually or collectively. For example, the DMA circuitry 502 may receive a request for data at address 320 and address 322. In such instances, since both of these addresses are part of the first plurality of addresses 302, the DMA circuitry 502 may provide a response, without accessing and/or retrieving data stored at the memory 504. In another example, the DMA circuitry 502 may receive a request for data at address 342 and address 322. In such instances, the DMA circuitry 502 may process the request as two separate requests, but may provide a single response to the device 506.

In some implementations, the communication between the device 506 and the hardware engine 602 flows through a DMA channel that bypasses a processor of the controller of the SSD storage device. FIG. 6 illustrates how two requests for data at different addresses can result in the hardware engine 602 performing different responses, and the SSD utilizing different resources.

Exemplary Flow Chart of Method of Processing Request for Storing Data

Figure 7:
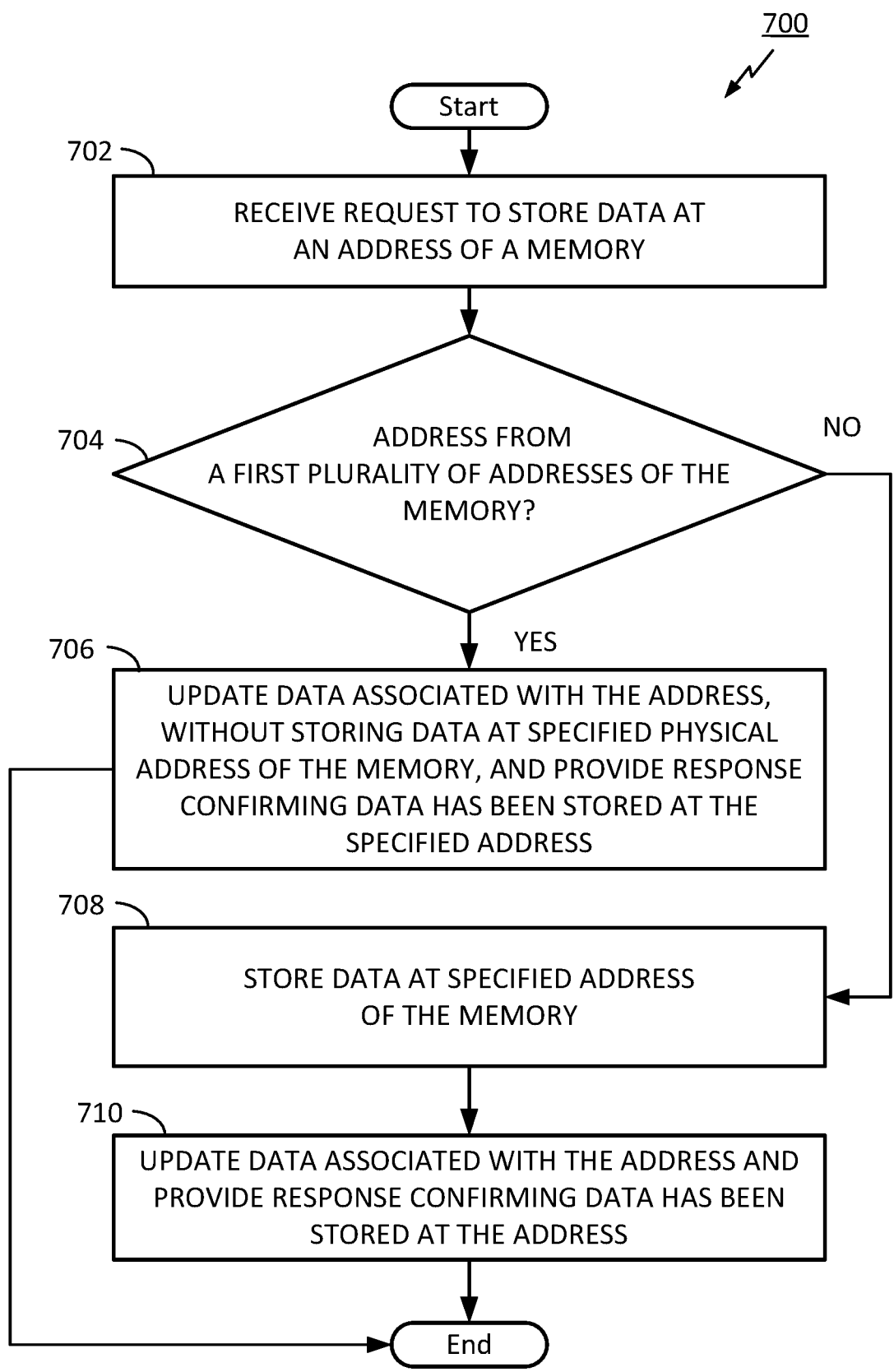
FIG. 7 illustrates a flow diagram of a method for storing data at a memory in accordance with embodiments of the present disclosure.

FIG. 7 illustrates a flow chart of a method 700 for processing requests (e.g., write requests) for storing data at a memory. The method shown in FIG. 7 may be performed by any of the SSDs described in the present disclosure, such as the SSD 102. Also, for purpose of clarity, the method shown in FIG. 7 does not necessarily show all the operations performed by the SSD. In some implementations, the method shown in FIG. 7 may include other operations that can be performed by the SSD. In some implementations, the order of the methods may be changed. The method 700 may be performed by a DMA circuitry and/or a monitor of the SSD, as described above. In some implementations, the method 700 may be performed by the DMA circuitry and/or the monitor of a hardware engine.

The method (at 702) receives a request (e.g., write request) for storing at an address (e.g., physical address) of a memory (e.g., 206) of the controller. The request may be received from a device, component, or peripheral outside of an SSD or outside of an SSD controller. The request may be received through a DMA channel that bypasses the processor (e.g., 202) of the controller (e.g., 200).

The method (at 704) determines whether the address specified in the request is an address from a first plurality of addresses (e.g., 302) of the memory (e.g., 206, 208). In some implementations, the first plurality of addresses of the memory are specified or allocated as free space. In which case, any request for storing data at an address from the first plurality of addresses is considered as request for storing data at a bit bucket. It is noted that the first plurality of addresses may include a range of addresses of various size and can include addresses located at more than one memory (e.g., first memory 206, second memory 208). The first plurality of addresses (e.g., 302) of the memory (e.g., 206, 208) may be a subset of addresses from a plurality of addresses of the memory.

The request may include one address or may include several addresses. In cases where there are several addresses with the request, the method may process each address separately and make a determination for each address separately. In some implementations, the method may process the addresses collectively by determining whether all the addresses satisfy the condition. In some implementations, if at least one address does not satisfy the condition, then all addresses from the request may be considered to have not satisfied the condition.

When the method determines (at 704) the address specified in the request is an address that is not from the first plurality of addresses, the method 700 proceeds to store (at 708) data at the specified address of the memory. The method then provides (at 710) a response that indicates that the data has been stored at the specified address of the memory. In this instance, the method determines that the request for storing data is not a request for storing data for a bit bucket data, or specifying a new value for the to be used as a bit bucket value.

However, when the method determines (at 704) the address specified in the request is an address from the first plurality of address of the memory, the method 700 proceeds to update (at 706) the new value for the bit bucket, without accessing and/or storing the data at the specified address of the memory, and provides a response that the new bit bucket value has been updated (e.g., updated within the DMA circuitry). In this instance, the method determines that the request for storing data is a request to update the bit bucket data. It is noted that in some implementations, updating the bit bucket value for one address from the first plurality of addresses means that all other addresses from the first plurality of addresses also had they bit bucket value updated. Thus, in subsequent requests for data at any of the addresses from the first plurality of addresses (which is specified as free space, be used as a bit bucket), the responses may include the same data, even if different residual data values are stored at these different addresses of the first plurality of addresses of the memory.

In some implementations, the method 700 may determine (at 704) that the request to write data to an address from the first plurality of addresses as an improper attempt to write data at an address that is allocated to be a free space. In such instances, the method may return an error message, instead of updating the new value of the bit bucket value.

The above method may be iteratively performed for some or all of the requests that flow through a DMA channel. The DMA circuitry and/or the monitor may monitor data traffic that flows through the DMA channel and performs the above method to determine how to process the requests. Each DMA circuitry and/or monitor of the SSD may perform the above method in parallel or sequentially to each other.

Figure 8:
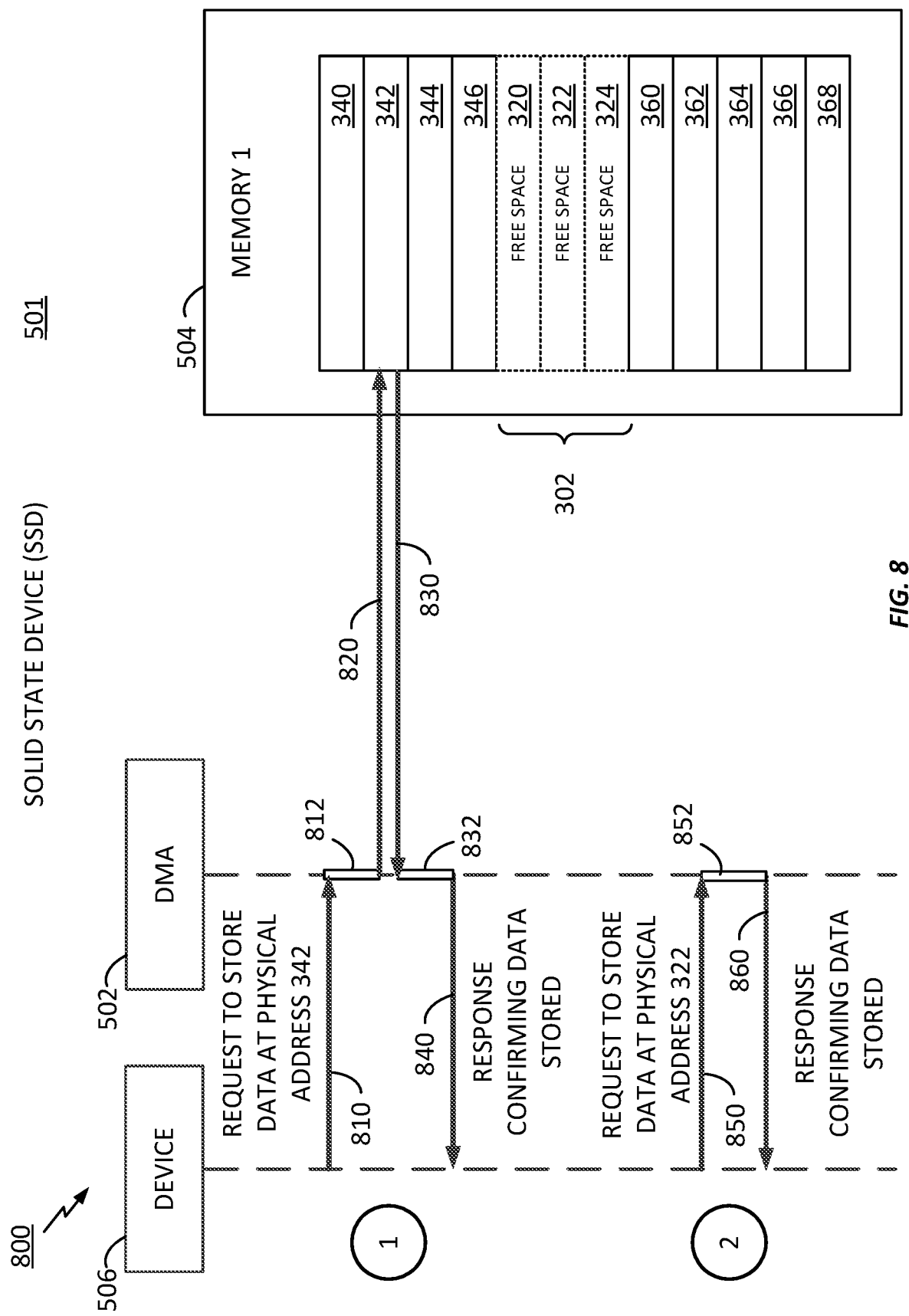
FIG. 8 illustrates a flow sequence diagram of a method for storing data at a memory in accordance with embodiments of the present disclosure.
Figure 9:
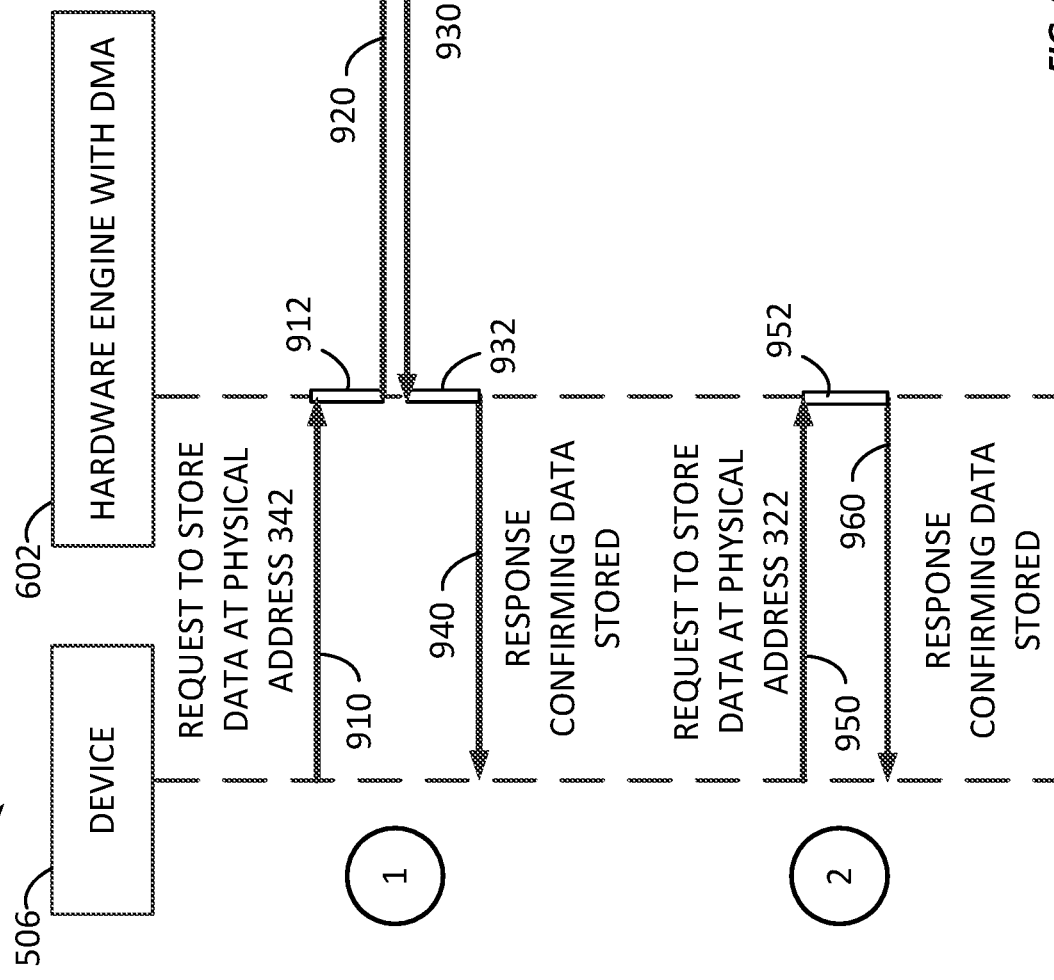
FIG. 9 illustrates a flow sequence diagram of a method for storing data at a memory in accordance with embodiments of the present disclosure.

Exemplary Flow Sequences of a Solid State Device (SSD) Processing Request for Writing Data at a Memory FIGS. 8 and 9 illustrate flow sequences of a solid state device (SSD) that processes various requests (e.g., write requests) for storing data. The flow sequences shown in FIGS. 8 and 9 may be performed by any of the SSDs described in the present disclosure, such as the SSD 102. Also, for purpose of clarity, the flow sequences shown in FIGS. 8 and 9 do not necessary show all the components of the SSD that perform the operations described in FIGS. 8 and 9. For example, one or more of the request, response, data described may travel through one or more buffers and/or one or more interconnects, when traveling between the different components of the SSD. In some implementations, the flow sequences shown FIGS. 8 and 9 may include other operations that are performed by the SSD.

FIG. 8 illustrates two flow sequences 800 that are performed by an SSD 501 coupled to a host (e.g., host 104). The flow sequences 800 include processing requests (e.g., write requests) for storing data at the memory 504. The SSD 501 includes a direct memory access (DMA) 502 circuitry and the memory 504. FIG. 8 also illustrates a device 506. The device 506 may be part of the SSD 501 or it may be a device that is external of the SSD 501. For purpose of describing FIG. 8, the device 506 shall be assumed to be implemented in the SSD 501.

As shown in FIG. 8, a first flow sequence illustrates that the DMA circuitry 502 receives a request (810) for storing data at address 342 of the memory 504, from the device 506. The DMA circuitry 502 determines (at 812) whether the address 342 is an address from a first plurality of addresses (e.g., 302). In this case, the address 342 is not part of the first plurality of addresses 302. As such, the DMA circuitry 502 stores data at the address 342 by (i) sending a request (820) to store data at address 342 to the memory 504, and (ii) receiving a response (830) that indicates the data has been stored at address 342, from the memory 504. The DMA circuitry 502 processes (at 832) the response from the memory 504, and then sends a response (840) that confirms the data has been at the address 342, to the device 506.

FIG. 8 illustrates a second flow sequence where the DMA circuitry 502 receives a request (850) for storing data at address 322 of the memory 504, from the device 506. The DMA circuitry 502 determines (at 852) whether the address 332 is an address from the first plurality of addresses (e.g., 302). In this case, the address 332 is part of the first plurality of addresses 302. The DMA circuitry 502 knows that addresses from the first plurality of addresses 302 are to return a particular value (e.g., zero data value, random value, pre-determined value). The DMA circuitry 502 processes (at 852) the request by updating the new value of the particular value (e.g., within the DMA circuitry 502) of the bit bucket. In addition, all other addresses from the first plurality of addresses may also be associated with the updated particular value. The DMA circuitry 502 may send a response (860) that indicates that the value of the bit bucket has been updated, without the DMA circuitry 502 accessing and/or storing data at the address 332 of the memory 504.

In some implementations, the DMA circuitry 502 may determine that the request to write data to address 332 an improper attempt to write data at an address that is allocated to be a free space. In such instances, the DMA circuitry 502 may return an error message, instead of updating the new value of the bit bucket value.

In some implementations, the communication between the device 506 and the DMA circuitry 502 flows through a DMA channel that bypasses a processor of the controller of the SSD. FIG. 8 illustrates how two requests for data at different addresses can result in the DMA circuitry 502 performing different responses, and the SSD 501 utilizing different resources.

FIG. 9 illustrates two flow sequences 900 that are performed by an SSD 501 coupled to a host (e.g., host 104). The flow sequences 900 include processing requests for storing data at the memory 504. The SSD 501 includes a hardware engine 602 and the memory 504. The hardware engine 602 may include a DMA circuitry. FIG. 9 also illustrates a device 506. The device 506 may be part of the SSD 501 or it may be a device that is external of the SSD 501. For purpose of describing FIG. 9, the device 506 shall be assumed to be implemented in the SSD 501.

As shown in FIG. 9, a first flow sequence illustrates that the hardware engine 602 receives a request (910) for storing data at address 342 of the memory 504, from the device 506. The hardware engine 602 determines (at 912) whether the address 342 is an address from a first plurality of addresses (e.g., 302). In this case, the address 342 is not part of the first plurality of addresses 302. As such, the hardware engine 602 stores data at the address 342 by (i) sending a request (920) to store data at address 342 to the memory 504, and (ii) receiving a response (930) that indicates the data has been stored at address 342, from the memory 504. The hardware engine 602 processes (at 932) the response from the memory 504, and then sends a response (940) that confirms the data has been at the address 342, to the device 506.

FIG. 9 illustrates a second flow sequence where the hardware engine 602 receives a request (950) for storing data at address 322 of the memory 504, from the device 506. The hardware engine 602 determines (at 952) whether the address 332 is an address from the first plurality of addresses (e.g., 302). In this case, the address 332 is part of the first plurality of addresses 302. The hardware engine 602 knows that addresses from the first plurality of addresses 302 are to return a particular value (e.g., zero data value, random value, pre-determined value). The hardware engine 602 processes (at 952) the request by updating the new value of the particular value (e.g., within the hardware engine 602) of the bit bucket. In addition, all other addresses from the first plurality of addresses may also be associated with the updated particular value. The hardware engine 602 may send a response (960) that indicates that the value of the bit bucket has been updated, without the hardware engine 602 accessing and/or storing data at the address 332 of the memory 504.

In some implementations, the hardware engine 602 may determine that the request to write data to address 332 is an improper attempt to write data at an address that is allocated to be a free space. In such instances, the hardware engine 602 may return an error message, instead of updating the new value of the bit bucket value.

In some implementations, the communication between the device 506 and the hardware engine 602 flows through a DMA channel that bypasses a processor of the controller of the SSD. FIG. 9 illustrates how two requests for data at different addresses can result in the hardware engine 602 performing different responses, and the SSD 501 utilizing different resources.

It is noted that the controller(s) (e.g., 105, 200) described in the disclosure are implemented in an SSD. However, the controller(s) may also be implemented in other devices. For example, the controller(s) described in the disclosure may be implemented in and/or with an image processing device and/or a device (e.g., graphic card, display, screen) that includes an image processing device. In such an example, the controller(s) may be used to process requests for pixels with certain values (e.g., pixels with black values, pixels with white values, pixels with a particular color, pixels patterns). For example, the image processing device may request pixels with values of black. In such instances, these values may be retrieved from a bit bucket of the controller. Thus, the method(s) and process(es) described in the disclosure may also be applied when the controller is implemented in other devices, such as an image processing device.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

What is claimed is:

1. A data storage apparatus comprising:
a non-volatile memory (NVM); and
a controller coupled to the NVM, the controller comprising:
a processor;
a memory coupled to the processor, wherein the memory comprises a plurality of addresses; and
a direct memory access (DMA) circuitry coupled to the processor and the memory, wherein the DMA circuitry is configured to:
receive a first read request for data stored at a first address of the memory;
determine whether the first address is an address from the plurality of addresses of the memory;
when the first address is amongst the plurality of addresses, provide a first response comprising a particular data, without retrieving data stored at the first address of the memory; and
when the first address is not amongst the plurality of addresses, (i) retrieve the data stored at the first address of the memory, and (ii) provide a first response comprising the data retrieved from the first address of the memory.

2. The data storage apparatus of claim 1, wherein each address from the plurality of addresses is configured to store dummy data.

3. The data storage apparatus of claim 1, wherein each address from the plurality of addresses is configured to return zero value data.

4. The data storage apparatus of claim 1, wherein for at least one read request, when the first address is amongst the plurality of addresses, the particular data that is included with the first response is different than the data that is stored at the first address of the memory.

5. The data storage apparatus of claim 1, wherein the DMA circuitry is further configured to:
receive a second read request for data stored at a second address of the memory;
determine whether the second address is an address from the plurality of addresses of the memory;
when the second address is amongst the plurality of addresses, provide a second response comprising the particular data, without retrieving data stored at the second address of the memory; and
when the second address is not amongst the plurality of addresses, (i) retrieve data stored at the second address of the memory, and (ii) provide a second response comprising the data retrieved from the second address of the memory.

6. The data storage apparatus of claim 5, wherein when the first address and the second address are addresses from the plurality of addresses, for each of the first read request and the second read request, the DMA circuitry provides a response that includes the same particular data, without retrieving data stored at the first address or the second address.

7. The data storage apparatus of claim 1, further comprising an error correcting code (ECC) device that includes a second direct memory access (DMA) circuitry, the ECC device coupled to the processor and the memory, wherein the second DMA circuitry is configured to:
receive a second read request for data stored at a second address of the memory;
determine whether the second address is an address from the plurality of addresses of the memory;
when the second address is amongst the plurality of addresses, provide a second response comprising the particular data, without retrieving data stored at the second address of the memory; and
when the second address is not amongst the plurality of addresses, (i) retrieve data stored at the second address of the memory, and (ii) provide a second response comprising the data retrieved from the second address of the memory.

8. The data storage apparatus of claim 1, wherein the plurality of addresses is configurable to have different numbers of addresses.

9. The data storage apparatus of claim 1, wherein the memory includes a first memory and a second memory, and wherein the plurality of addresses includes at least one address at the first memory and at least one address at the second memory.

10. A data storage apparatus comprising:
a non-volatile memory (NVM); and
a controller coupled to the NVM, the controller comprising:
  a processor;
  a memory coupled to the processor, wherein the memory comprises a plurality of addresses, the plurality of addresses configured to store dummy data; and
  a first hardware engine coupled to the processor and the memory, the first hardware engine comprising a first internal memory, wherein the first hardware engine is configured to:
    receive a first read request for data stored at a first address of the memory;
    determine whether the first address is an address from the plurality of addresses of the memory;
    when the first address is amongst the plurality of addresses, provide a first response comprising a particular data stored at the first internal memory, without retrieving data stored at the first address of the memory; and
    when the first address is not amongst the plurality of addresses, (i) retrieve the data stored at the first address of the memory, and (ii) provide a first response comprising the data retrieved from the first address of the memory.

11. The data storage apparatus of claim 10, wherein the first hardware engine comprises an error correcting code (ECC) device, and the data storage apparatus is free of a stand-alone bit bucket device.

12. The data storage apparatus of claim 10, further comprising a second hardware engine coupled to the processor and the memory, the second hardware engine comprising a second internal engine, wherein the second hardware engine is configured to:
  receive a second read request for data stored at a second address of the memory;
  determine whether the second address is an address from the plurality of addresses of the memory;
  when the second address is amongst the plurality of addresses, provide a second response comprising a second particular data stored at the second internal memory, without retrieving data stored at the second address of the memory; and
  when the second address is not amongst the plurality of addresses, (i) retrieve the data stored at the second address of the memory, and (ii) provide a second response comprising the data retrieved from the second address of the memory.

13. The data storage apparatus of claim 12, wherein the second hardware engine comprises a low-density parity check (LDPC) device, and the data storage apparatus is free of a stand-alone bit bucket device.

14. A method for operating a data storage apparatus, comprising:
receiving a first read request for data stored at a first address of a memory of the data storage apparatus;
determining whether the first address is an address from a plurality of addresses of the memory;
when the first address is amongst the plurality of addresses, providing a first response comprising a particular data, without retrieving data stored at the first address of the memory; and
when the first address is not amongst the plurality of addresses, (i) retrieving data stored at the first address of the memory, and (ii) providing a first response comprising the data retrieved from the first address of the memory.

15. The method of claim 14, wherein for at least read request, when the first address is an address from the plurality of addresses, the particular data that is included with the first response is different than the data that is stored at the first address of the memory.

16. The method of claim 14 further comprising:
receiving a second read request for data stored at a second address of the memory;
determining whether the second address is an address from the plurality of addresses of the memory;
when the second address is amongst the plurality of addresses, providing a second response comprising the particular data, without retrieving data stored at the second address of the memory; and
when the second address is not amongst the plurality of addresses, (i) retrieving data stored at the second address of the memory, and (ii) providing a second response comprising the data retrieved from the second address of the memory.

17. The method of claim 14, wherein when a read request is received through a direct memory access (DMA) circuitry, data that is retrieved from the first address of the memory, bypasses a processor of a controller of the data storage apparatus, and travels through the DMA circuitry of the controller.

18. The method of claim 14, wherein when the read request is received through an error correcting code (ECC) device or a low-density parity check (LDPC) device, data that is retrieved from the first address of the memory, bypasses a processor of a controller of the data storage apparatus, and travels through the ECC device or the LDPC of the controller.

19. The method of claim 14, further comprising:
receiving a third write request for storing a particular data at a third address of the memory;
determining whether the third address is an address from the plurality of addresses of the memory;
when the third address is amongst the plurality of addresses, providing a third response, without storing the particular data at the third address of the memory; and
when the third address is not amongst the plurality of addresses, (i) storing the particular data at the third address of the memory, and (ii) providing a third response indicating that the particular data has been stored at the third address of the memory.

20. The method of claim 14, further comprising monitoring requests through at least one direct memory access (DMA) channel to determine whether a read request for data is for an address from the first plurality of addresses of the memory.

21. An apparatus comprising:
means for non-volatile storing of data; and
means for controlling the means for non-volatile storing of data, comprising:

means for processing data;

means for storing data comprising a plurality of addresses, the means for storing data coupled to the means for processing data, wherein the plurality of addresses is configurable to have different numbers of addresses; and means for direct memory access (DMA) coupled to the means for storing data and the means for processing data, wherein the means for DMA is configured to:

receive a first read request for data stored at a first address of the memory;

determine whether the first address is an address from the plurality of addresses of the memory;

when the first address is amongst the plurality of addresses, provide a first response comprising a particular data, without retrieving data stored at the first address of the means for storing data, wherein the particular data that is included with the first response is different than the data that is stored at the first address of the means for storing data; and when the first address is not amongst the plurality of addresses, (i) retrieve data stored at the first address of the means for storing data, and (ii) provide a first response comprising the data retrieved from the first address of the means for storing data.

22. The apparatus of claim 21, wherein for at least one read request, when the first address is an address from the plurality of addresses, the particular data that is included with the first response is different than the data that is stored at the first address of the means for storing data.

23. The apparatus of claim 21, wherein the means for DMA is further configured to:

receive a second write request for storing a particular data at a second address of the means for storing data;

determine whether the second address is an address from the plurality of addresses of the means for storing data;

when the second address is amongst the plurality of addresses, provide a second response, without storing the particular data at the second address of the means for storing data; and when the second address is not amongst the plurality of addresses, (i) store the particular data at the second address of the means for storing data, and (ii) provide a second response indicating that the particular data has been stored at the second address of the means for storing data.

24. A controller comprising:

a processor;

a memory coupled to the processor, the memory comprising a plurality of addresses, wherein the plurality of addresses is programmable such that a subset of addresses from the plurality of addresses, is configured to be used as a bit bucket; and a direct memory access (DMA) circuitry coupled to the processor and the memory, wherein the DMA circuitry is configured to:

receive a first read request for data stored at a first address of the memory;

determine whether the first address is an address from the subset of addresses of the memory;

when the first address is amongst the subset of addresses, provide a first response comprising a particular data, without retrieving data stored at the first address of the memory; and when the first address is not amongst the subset of addresses, (i) retrieve the data stored at the first address of the memory, and (ii) provide a first response comprising the data retrieved from the first address of the memory.

25. The controller of claim 24, wherein the controller is coupled to an image processing device.

26. The controller of claim 25, wherein the first read request is a request for pixels that have values of black.

27. The controller of claim 24, wherein the controller is implemented as a System on Chip (SoC).

28. The controller of claim 24, wherein the processor is a processing die and the memory is a memory die.

29. The controller of claim 24, wherein each address from the subset of addresses is configured to store dummy data.

30. The controller of claim 24, wherein for at least one read request, when the first address is amongst the subset of addresses, the particular data that is included with the first response is different than the data that is stored at the first address of the memory.

* * * * *